US006176461B1

United States Patent
Beaman et al.

(10) Patent No.: US 6,176,461 B1
(45) Date of Patent: *Jan. 23, 2001

(54) ENCLOSURE APPARATUS WITH REMOVABLE BASE

(75) Inventors: Daniel Paul Beaman, Cedar Park; M. Lawrence Buller, Austin; Larry Thomas Cooper, Round Rock; Brian Michael Kerrigan; Tristan Alfonso Merino, both of Austin; John Richard Pugley, Round Rock, all of TX (US)

(73) Assignee: International Business Machines Corp., Armonk, NY (US)

( * ) Notice: Under 35 U.S.C. 154(b), the term of this patent shall be extended for 0 days.

This patent is subject to a terminal disclaimer.

(21) Appl. No.: 09/190,563

(22) Filed: Nov. 12, 1998

(51) Int. Cl.[7] .................................................. F16M 01/00
(52) U.S. Cl. ......................... 248/671; 248/678; 248/673; 312/223.2
(58) Field of Search ...................... 248/678, 677, 248/673, 671, 346.04, 346.5, 346.03, 918; 312/223.1, 223.2, 351.1; 403/381, 334, 331

(56) References Cited

U.S. PATENT DOCUMENTS

| | | | |
|---|---|---|---|
| 2,116,584 | * 5/1938 | Shelby | 403/381 |
| 3,090,086 | * 5/1963 | Fata | 248/309.1 |
| 4,747,570 | * 5/1988 | Takahashi | 248/309.1 |
| 5,397,081 | * 3/1995 | Landry et al. | 248/346.5 |
| 5,450,285 | * 9/1995 | Shiemmer | 361/724 |
| 5,462,350 | * 10/1995 | Brightman et al. | 312/351.7 |
| 5,749,637 | * 5/1998 | McMahan et al. | 312/223.2 |
| 5,887,962 | * 3/1999 | Tsai | 312/351.9 |
| 5,890,693 | * 4/1999 | Do et al. | 248/346 |
| 5,975,659 | * 11/1999 | Yang et al. | 312/351.9 |
| 5,978,217 | * 11/1999 | Kerrigan et al. | 248/346.03 |
| 6,059,384 | * 5/2000 | Ho | 312/223.2 |

* cited by examiner

*Primary Examiner*—Anita M. King
*Assistant Examiner*—Naschica Sanders
(74) *Attorney, Agent, or Firm*—Robert V. Wilder; Casimer K. Salys

(57) ABSTRACT

A method and implementing computer system enclosure is provided which includes a selectively removable base support unit which is designed to stabilize vertical mounting capabilities when the base unit is attached to the enclosure and to allow horizontal mounting of the electronics enclosure when the base unit is detached. The electronics enclosure includes a locking edge on one of its sides. The locking edge is selectively engageable with a base support unit to provide a wide footprint for stable mounting of the electronics enclosure on the side of the enclosure which has the base unit attached. In an exemplary embodiment, the locking edge is tapered to force a tight fit between the enclosure and the support base unit. A locking mechanism is also operable at one end of the support base unit-electronics enclosure interface to provide a positive stop to lock the enclosure in place relative to the support base unit.

15 Claims, 4 Drawing Sheets

ENCLOSURE APPARATUS WITH REMOVABLE BASE

FIELD OF THE INVENTION

The present invention relates generally to electronics enclosures and more particularly to a methodology and implementation for providing an electronics enclosure which is convertible to stable positions in horizontal and vertical orientations.

BACKGROUND OF THE INVENTION

The continuing advances in the state of the art in integrated circuits are resulting in smaller electronics devices in all fields and applications. This phenomenon is readily apparent with all electronic devices including PCs (personal computers), workstations and other computer-related systems. Recently, the widespread acceptance and use of the Internet has created a demand for even smaller computer related terminals referred to as "network computers". The shrinkage of the electronics enclosures has resulted in thinner boxes which make it difficult or even impossible to position the box or enclosure on its side for vertically oriented placement since the thinner dimensions of the enclosure create an unstable base for vertical mounting situations.

Moreover, in many applications, it is desirable and even necessary to have the option to position the main computer enclosure in either a vertical orientation (typically for a workstation application) or a horizontal orientation (typically for a desktop application). Further, for most applications, the PC or network computer needs to be configured mechanically to be able to be mounted in either orientation, and also the electronics enclosure needs to be designed for compact packaging and shipment to dealers and end users.

Thus, there is a need for an improved methodology and implementing arrangement which allows and enables mechanical configuration options to provide for mechanically stable placement of thin electronics enclosures in either horizontal or vertical orientations.

SUMMARY OF THE INVENTION

A method and implementing electronics enclosure is provided which includes a selectively removable base support unit designed to stabilize vertical mounting capabilities when the base unit is attached to the enclosure, and to allow horizontal mounting of the electronics enclosure when the base unit is detached. The electronics enclosure includes a holding device to hold the base unit to the enclosure and a locking device to secure the base unit in a proper position relative to the enclosure. In an exemplary embodiment, a locking edge on the enclosure is tapered to force a secure fit between the enclosure edge and the support base unit.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

The various methods and arrangements discussed herein may be implemented with regard to any electronics or other enclosure to provide for vertically stable mounting of the enclosure. For purposes of illustration however, the underlying concepts of the present invention are hereinafter explained in connection with the electronics enclosure for a "PC", a computer workstation or a "network compute", it being understood that the inventive techniques may be used in other applications as well. Details of the exemplary embodiment s shown herein are presented only in detail sufficient to understand the principles of the invention and are not specified to any greater extent than that considered necessary as illustrated, for the understanding and appreciation of the underlying concepts of the present invention and in order not to obfuscate or distract from the teachings of the present invention. Throughout the disclosure, like numerals refer to like parts in all of the Figures although not all of the parts are specifically and individually identified in all drawings.

Figure 1:
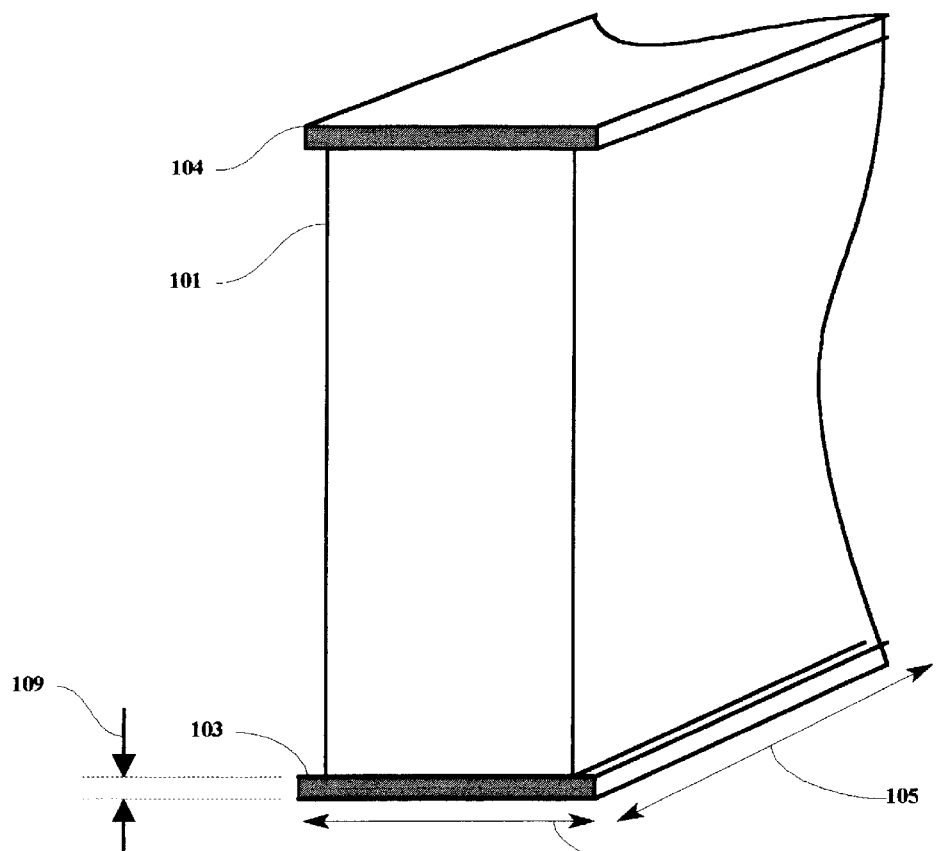
FIG. 1 is a partially cut-away perspective view of an electronics enclosure in accordance with one embodiment of the present invention.

In FIG. 1, there is shown a partially cut-away perspective view of an electronics enclosure in accordance with an exemplary embodiment of the present invention. As illustrated, an electronics enclosure 101, such as the main electronics enclosure for a computer system, is shown in a vertically oriented position, standing on one of the enclosure's narrow sides. The enclosure 101 includes edges or edged side walls 103 and 104 which are identical in the example, and mounted on opposite narrow ends of the enclosure 101. The edges can be separate elements mounted to the corresponding side walls of the enclosure 101 to extend beyond the enclosure walls, or the side walls themselves could be constructed to be "oversized" in order to overlap or extend beyond the enclosure to form the edges 103 and 104 as shown. Also, although the edges are illustrated as being rectangular in cross section, the edges may be other configurations as well (e.g. trapezoidal, etc.) so long as the edge on the enclosure can be mated with a corresponding coupling on an attaching base support apparatus as hereinafter described. Implementations other than an edge coupling may also be adapted to provide an equivalent "attaching device" on the enclosure cabinet 101.

Figure 5:
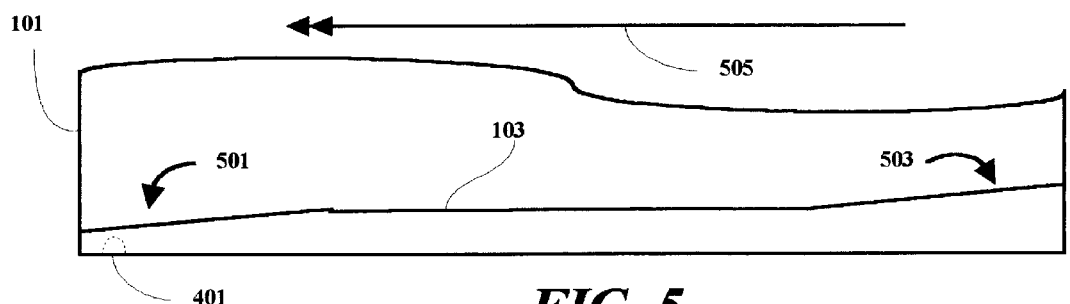
FIG. 5 is an illustration showing a tapered edge for the electronics enclosure of the present invention.
Figure 6:
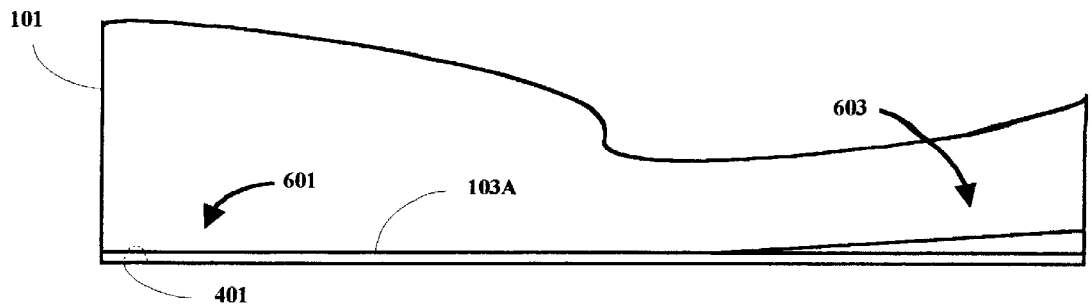
FIG. 6 is an illustration of an alternate tapered edge arrangement for the electronics enclosure.

In FIG. 1, the edges 103, 104 are shown to have a length 105, a width 107 and a thickness 109. The edges 103, 104 are arranged to extend along the length of the enclosure 101 on opposite sides thereof. In the example, the thickness of the edged side walls 103 and 104 is varied (as shown in FIG. 5 and FIG. 6) along the length 105 of the side walls to facilitate and provide a secure attaching arrangement for an attached base support unit. In the FIG. 1 example, matching edges 103 and 104 are illustrated although the present invention may be practiced with a single edge embodiment as hereinafter described in connection with FIG. 8. It is noted that the embodiment illustrated in FIG. 1, with the edges 103 and 104, may be positioned "as is" in a level and horizontal orientation, and the enclosure 101 will be supported by both edges 103 and 104. However, for positioning the enclosure 101 in a vertical orientation as shown, additional stability is provided by attaching base support unit 201, as depicted in FIG. 2, to one of the edges 103 or 104.

Figure 2:
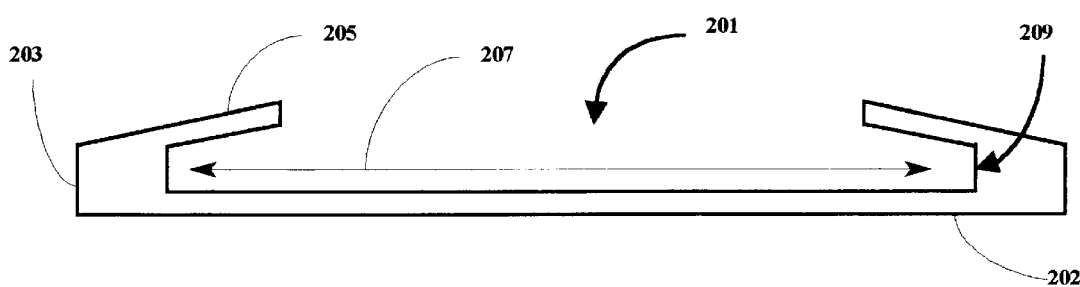
FIG. 2 is an elevation view of an exemplary base support unit for the enclosure illustrated in FIG. 1.

FIG. 2 shows an elevation view of an exemplary base support unit 201 designed to attach to the enclosure 101 illustrated in FIG. 1. As illustrated, the base support unit 201 includes a base portion 202, support side walls 203 and latching or holding walls 205. The base support unit 201 is designed to define a cavity for receiving and attaching to one of the edged side walls of the enclosure 101, such that the width of the attached edged side wall 107 will fit within the space 207 defined by the holding walls 205 of the base support unit 201. The inside side wall 209 of the base support unit 201 is sized to be slightly larger than the thickness 109 of the edged side wall 103.

Figure 3:
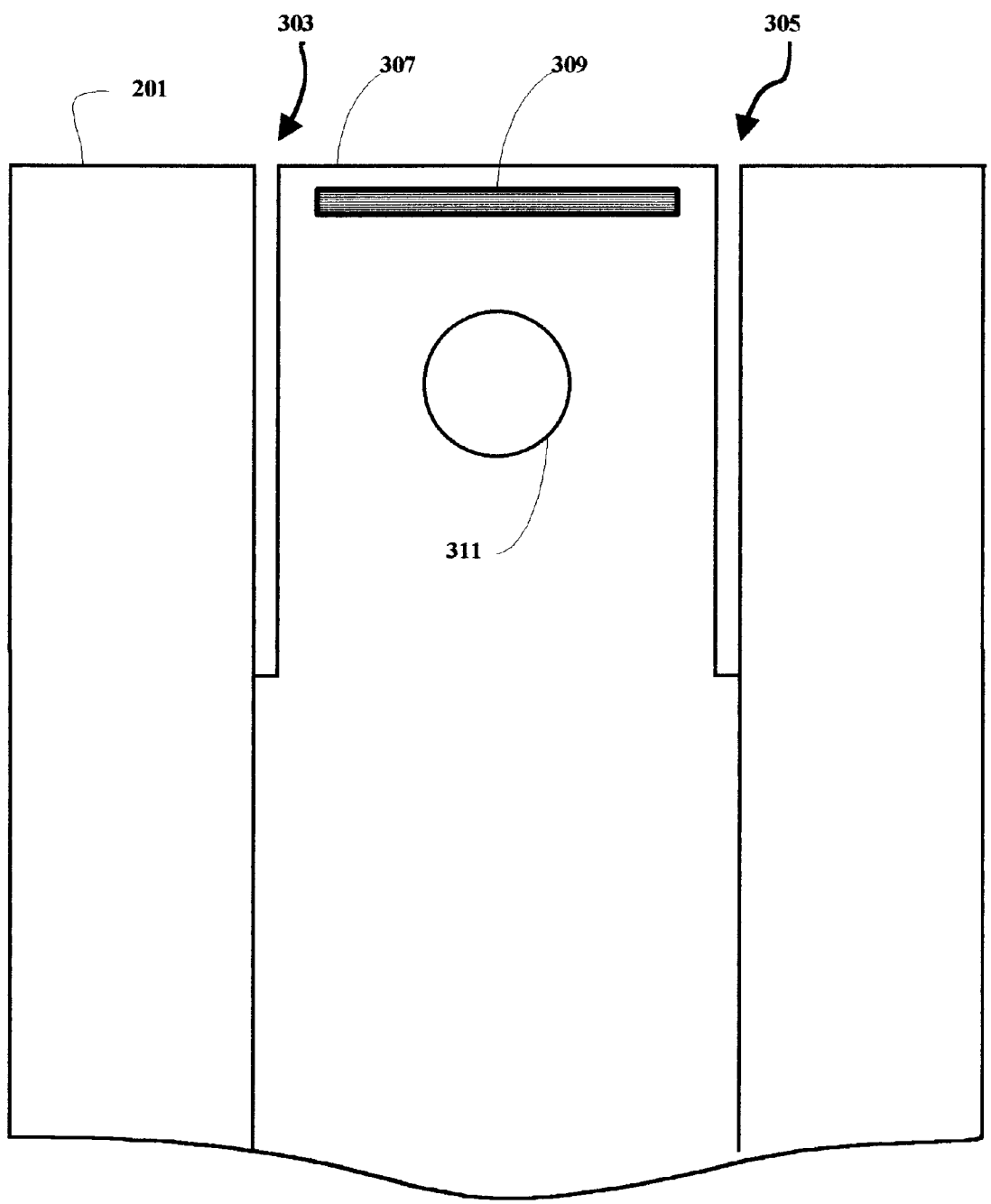
FIG. 3 is an illustration of one end of the base support unit showing an exemplary locking device.

FIG. 3 shows an illustration of one end of the base support unit 201. As illustrated, the base support unit 201 includes cut-out areas 303 and 305 to define a flexible locking section or locking device 307 of the base support unit 201. The locking device 307 includes a locking element including a raised locking element or locking extension 309 which forms an extension from the bottom surface of the base support unit 201. The locking device 307 also includes a gripping device such as a finger grip 311 to allow a user to grip the locking device 307 to engage and disengage the locking extension 309 from a corresponding locking configuration built into the enclosure 101 as shown in FIG. 4.

Figure 4:
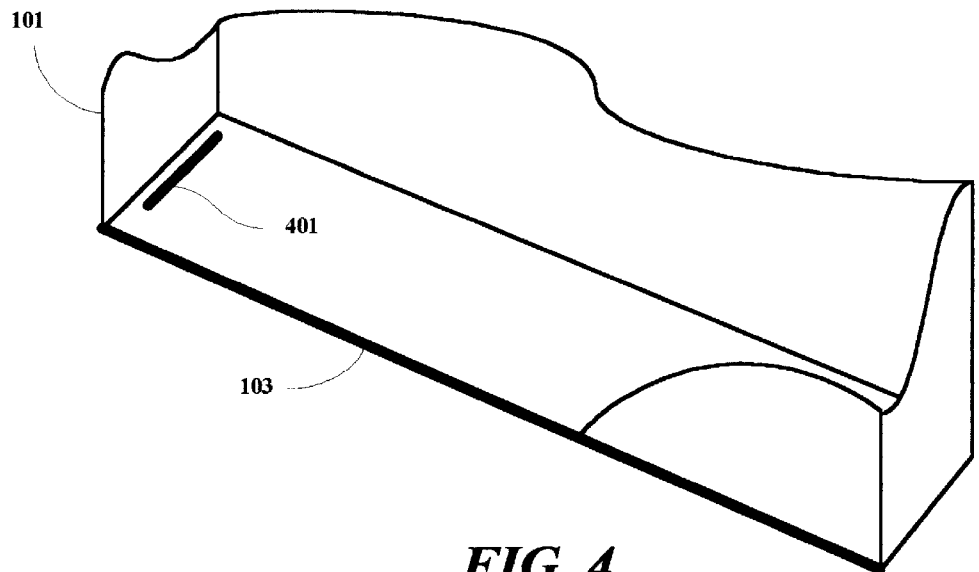
FIG. 4 is a partially cut-away view of an electronics enclosure showing a mating locking device designed to engage with the base unit locking device illustrated in FIG. 3.

FIG. 4 is a partially cut-away view of the electronics enclosure 101 showing a mating locking receptacle 401 designed to receive the locking extension 309 shown in FIG. 3. In the illustrated example, the locking receptacle 401 is a cavity although the locking device 401 may also be implemented with a recessed area to receive the extension 309. The locking function provided by the extension 309 and the locking receptacle or locking cavity 401 is designed to provide a positive indication that the end of the enclosure has been reached as the enclosure 101 slides into engagement with the base support unit 201. At the end of travel, the base support unit 201 will be aligned with, and substantially coextensive with, a side wall of the enclosure 101. At that point, the extension 309 will be locked into engagement with the locking cavity 401 thereby securing the base support unit 201 in place relative to the enclosure 101. The engagement will be maintained by the spring action of the flexible locking device 307. When the base support unit 201 is to be disengaged from the enclosure 101, the gripping device or finger grip 311 is utilized to pull the extension 309 out of engagement with the locking cavity 401 while sliding the base support unit 201 off of the enclosure edge 103 to which it is attached.

FIG. 5 is an illustration showing a tapered edge for the attaching side wall of the electronics enclosure 101. The tapering of the edge is exaggerated out of scale in the drawings in order to better illustrate the construction. As shown, each enclosure side wall uses two tapered edges, one in the front 501 and one in the rear 503. That arrangement is effective to remove the clearances between the two mating parts 103 and 201 when the support unit 201 is fully engaged with the edge 103 on the enclosure 101. The enclosure side wall edge 103 may also be gradually tapered at a constant rate from front 501 to back 503, or tapered only at the rear portion 503. In any construction, when the base support unit 201 is fully engaged with and attached to the enclosure side wall 103, the locking extension 309 will be engaged with the locking cavity 401, and the enclosure side wall edge 103 will fit tightly and securely within the base support unit cavity 207. The tapering also insures that the side wall edge can be slid into the base support unit 201 from only one direction 505, with the front 501 of the edge 103 being inserted first into the base support unit 201. The locking extension and the corresponding locking cavity may be arranged at either end of the base support unit although the preferred arrangement is as illustrated.

In FIG. 6, an alternate tapered edge arrangement for the electronics enclosure is illustrated in which a major portion 601 of the mounting edge 103A is constant and only an end section 603 is tapered. As hereinbefore noted, other tapering arrangements may also be implemented to accomplish the function of allowing easy insertion of the base support unit while at the same time insuring a secure fit when fully attached to the enclosure 101.

Figure 7:
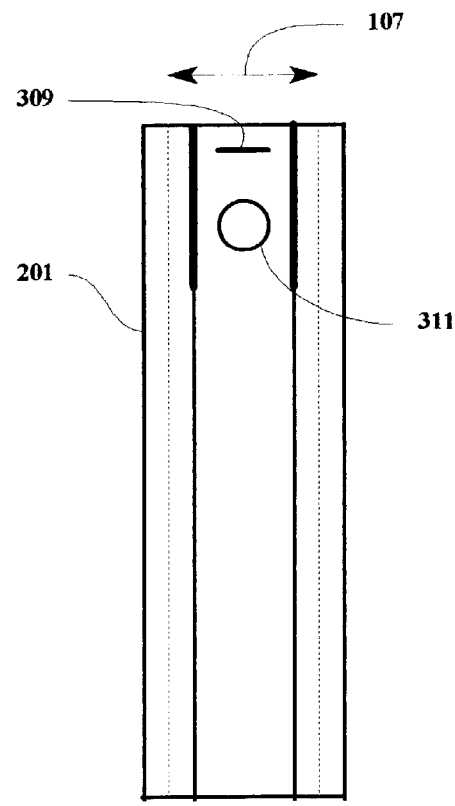
FIG. 7 is a top view of an exemplary base support unit.

FIG. 7 is a complete top view of the exemplary base support unit 201 showing the locking extension 309, the finger grip 311 and the width 107 of the enclosure mounting edge 103.

Figure 8:
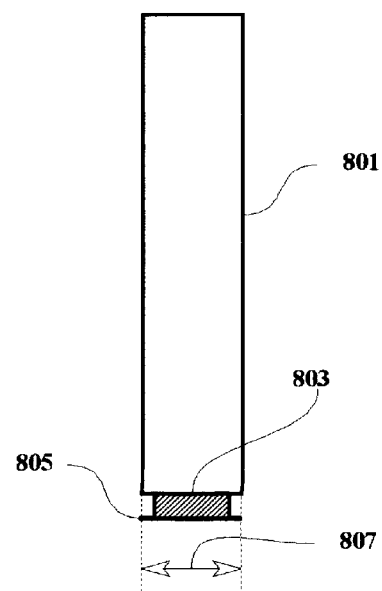
FIG. 8 is an illustration showing a single-side edge design for the electronics enclosure of the present invention.

FIG. 8 is an illustration showing a single-side edge design for the electronics enclosure of the present invention. In FIG. 8 a support structure 803 is shown attached to the enclosure 801. The support structure 803 is designed to be narrower than the side wall of the enclosure 801 to allow an attaching edge 805 to extend beyond the width of the support structure 803 so that the base support unit 201 may attach to and slide into engagement with the attaching edge 805. The operation of the base support unit attachment methodology is similar to the engagement of the side wall edge 103 and the base support unit 201 as hereinbefore described. The width of the attaching edge 805 is designed to be substantially the same as the width of the enclosure side wall so that the enclosure may be placed in a stable and level position on a desktop if a user desires a horizontal orientation without using the base support unit 201.

The method and apparatus of the present invention has been described in connection with a preferred embodiment as disclosed herein. The disclosed methodology may be implemented in a wide range of mechanically equivalent arrangements to accomplish the desired results as herein illustrated. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A support apparatus for use in providing support for an enclosure, said enclosure including top and bottom surfaces and a plurality of side walls between said top and bottom surfaces, said side walls each having a known surface area, said support apparatus comprising:

a base member, said base member including attaching means, said attaching means being selectively operable for coupling said base member to one of said side walls, said base member defining a support area arranged to be placed on a flat surface, said base member support area being greater than any of said enclosure side wall surface areas whereby said support apparatus is effective, when coupled to one of said side walls, to provide additional support to said one of said side walls for mounting said enclosure in a vertically oriented position on said one of said side walls, said one of said side walls including an attaching edge arranged for connection to said attaching means of said support apparatus, said attaching edge having a thickness dimension which is varied along a length of said attaching edge.

2. The support apparatus as set forth in claim 1 wherein said enclosure includes four side walls.

3. The support apparatus as set forth in claim 1 and further including:
   a locking device, said locking device being operable to lock said support apparatus in a predetermined position relative to said one of said side walls.

4. The support apparatus as set forth in claim 3 wherein said one of said side walls further includes means defining a locking receptacle, said locking device on said support apparatus further including a locking extension designed to engage with said locking receptacle to hold said support apparatus in said predetermined position relative to said one of said side walls.

5. The support apparatus as set forth in claim 4 wherein said locking extension is biased into a locking position with said locking receptacle.

6. The support apparatus as set forth in claim 5 wherein said support apparatus further includes a locking release device, said locking release device being selectively operable for releasing said locking extension from said locking position.

7. The support apparatus as set forth in claim 1 wherein said attaching means comprises a mounting structure extending along a length of said attaching means, said mounting structure being arranged for insertion of said attaching edge of said one of said side walls.

8. The support apparatus as set forth in claim 7 and further including:
   a locking device, said locking device being operable to lock said support apparatus in a predetermined position relative to said one of said side walls.

9. The support apparatus as set forth in claim 1 wherein the thickness of said attaching edge is increased along at least a portion of said attaching edge.

10. The support apparatus as set forth in claim 9 wherein the thickness of said attaching edge is increased gradually from one end of said attaching edge to an opposite end of said attaching edge.

11. The support apparatus as set forth in claim 1 wherein said enclosure includes an enclosure extension structure connected to one of said side walls, said enclosure extension structure including an outer attaching surface arranged for being coupled to said attaching means of said base member.

12. An enclosure apparatus comprising:
   a top surface;
   a bottom surface;
   a plurality of side walls;
   an attaching structure connected to one of said side walls; and
   a support apparatus coupled to said attaching structure, said support apparatus being arranged to provide a support area greater than a side wall area of said enclosure to enable a positioning of said enclosure in a vertical orientation wherein said enclosure is positioned to be supported by a side of said enclosure to which said support apparatus is coupled, said one of said side walls including an attaching edge arranged for connection to said attaching structure, said attaching edge having a thickness dimension which is varied along a length of said attaching edge.

13. The enclosure apparatus as set forth in claim 12 and further including selectively operable detaching means arranged to enable a selective detachment of said support apparatus from said attaching structure on said enclosure.

14. A method for providing increased stability in placing an enclosure on a side of said enclosure, said method comprising:
   attaching a support apparatus to said side of said enclosure, said support apparatus being arranged to provide a support area greater than an area of said side of said enclosure when said support apparatus is attached to said enclosure; and
   locking said support apparatus in a predetermined stable position relative to said side of said enclosure, said side of said enclosure including an attaching edge arranged for connection to said support apparatus, said attaching edge having a thickness dimension which is varied along a length of said attaching edge.

15. The method as set forth in claim 14 and further including:
   selectively operating a release mechanism to release said support apparatus from said side of said enclosure; and
   removing said support apparatus from said side of said enclosure.

* * * * *